United States Patent
Komori et al.

(12) 
(10) Patent No.: US 6,437,235 B1
(45) Date of Patent: Aug. 20, 2002

(54) SOLAR CELL MODULE, SOLAR CELL-BEARING ROOF AND SOLAR CELL POWER GENERATION SYSTEM

(75) Inventors: Ayako Komori, Mishima; Toshihiko Mimura, Nara; Masahiro Mori, Souraku-gun; Yuji Inoue, Nara; Satoru Shiomi, Mishima; Yoshitaka Nagao, Souraku-gun; Makoto Sasaoka; Hidehisa Makita, both of Kyotanabe; Shigenori Itoyama, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/534,066

(22) Filed: Mar. 24, 2000

(30) Foreign Application Priority Data

Mar. 26, 1999 (JP) ............................. 11-084186
Mar. 16, 2000 (JP) ......................... 2000-074413

(51) Int. Cl.⁷ ............................. H01L 31/048
(52) U.S. Cl. ................. 136/251; 136/244; 136/259; 136/291; 60/641.8; 52/173.3
(58) Field of Search ................... 136/251, 244, 136/259, 291; 60/641.8; 52/173.3

(56) References Cited

U.S. PATENT DOCUMENTS 4,544,798 A * 10/1985 Cannella .................... 136/251

5,800,631 A * 9/1998 Yamada et al. ............. 136/251

FOREIGN PATENT DOCUMENTS

| JP | 8-86066 | | 4/1996 |
| JP | 8-302942 | | 11/1996 |
| JP | 8-302942 A | * | 11/1996 |
| JP | 9-64396 | | 3/1997 |
| JP | 9-69646 | | 3/1997 |
| JP | 9-119202 A | * | 5/1997 |
| JP | 9-148614 | | 6/1997 |
| JP | 10-227102 | | 8/1998 |

* cited by examiner

*Primary Examiner*—Alan Diamond
(74) *Attorney, Agent, or Firm*—Fitzpatrick Cella Harper & Scinto

(57) ABSTRACT

A solar cell module has an outermost surface comprising a surface member on the light receiving face side of the solar cell module, a back face comprising a back face member on the non-light receiving face side of the solar cell module, and a photovoltaic element between the surface member and the back face member. The solar cell module is characterized in that it has a porous incombustible member having a structural strength between the photovoltaic element and the back face member. A solar cell-bearing roof and a solar cell power generation system in which the solar cell module is used are also disclosed.

16 Claims, 7 Drawing Sheets

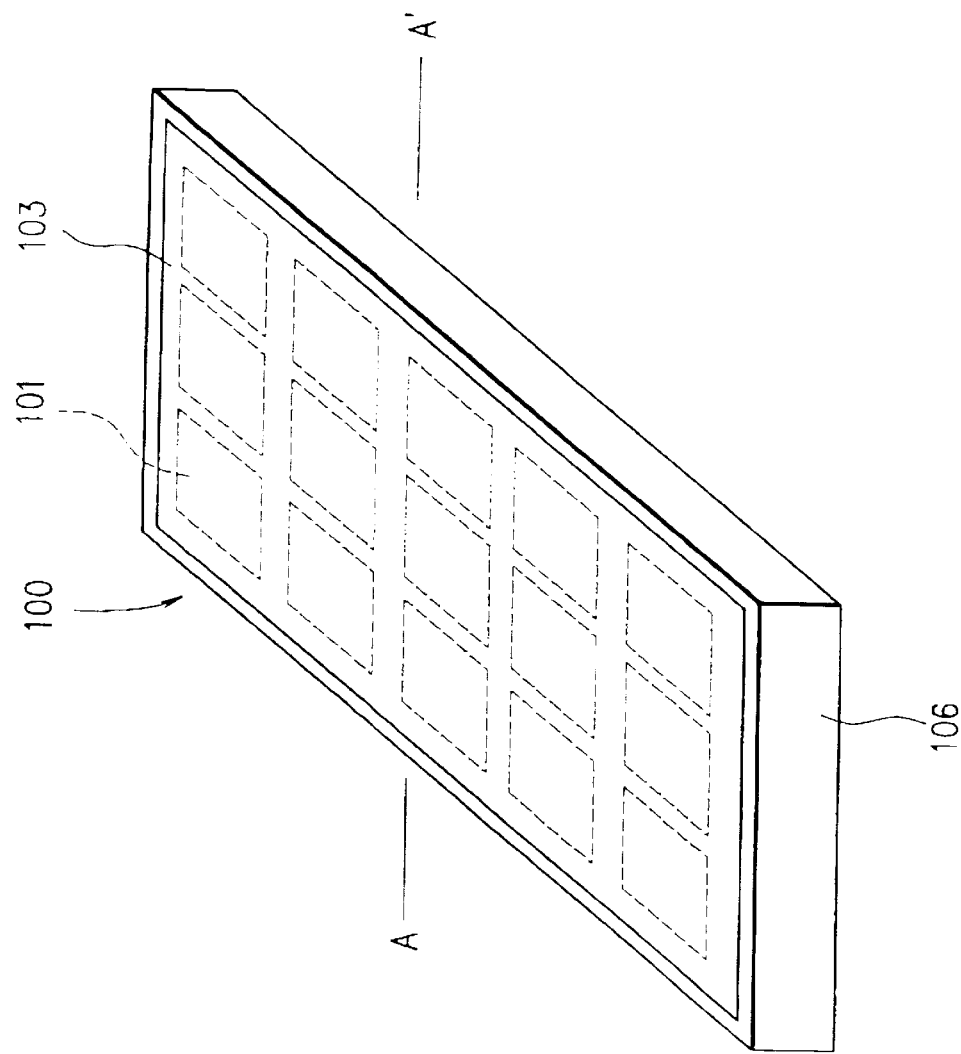

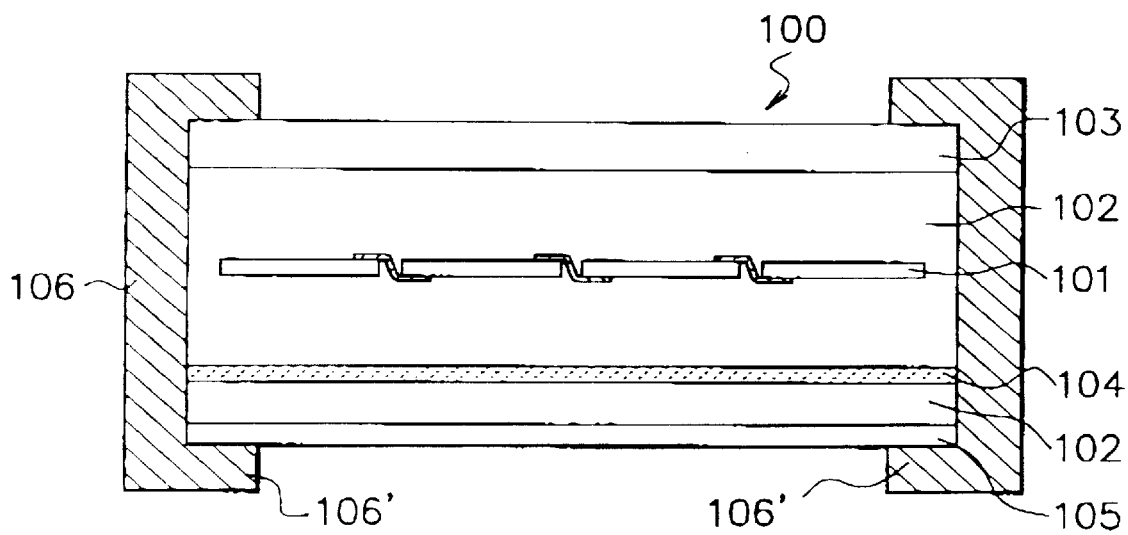
F I G. 1(b)
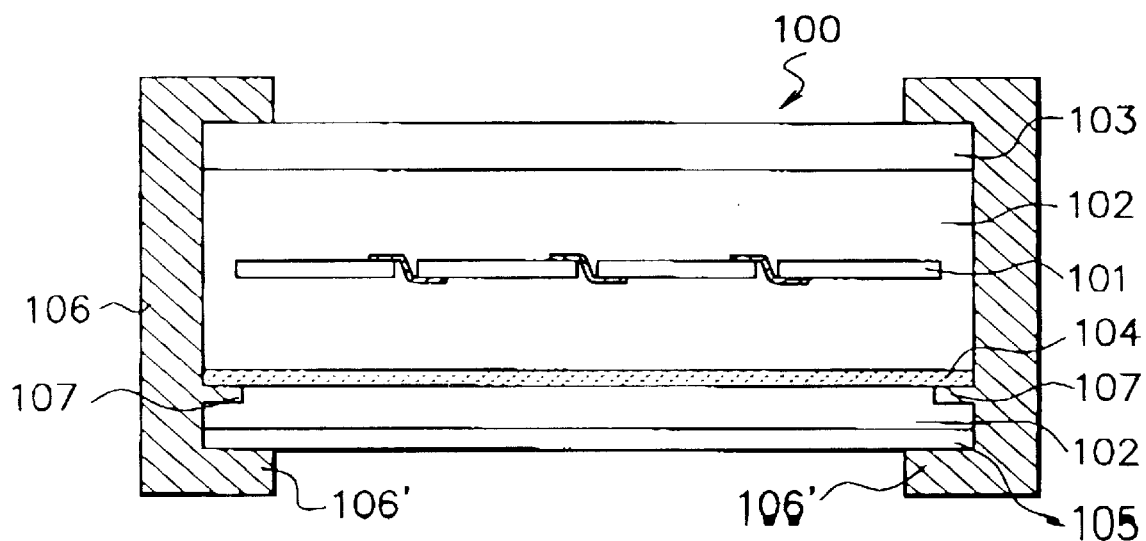
F I G. 1(c)

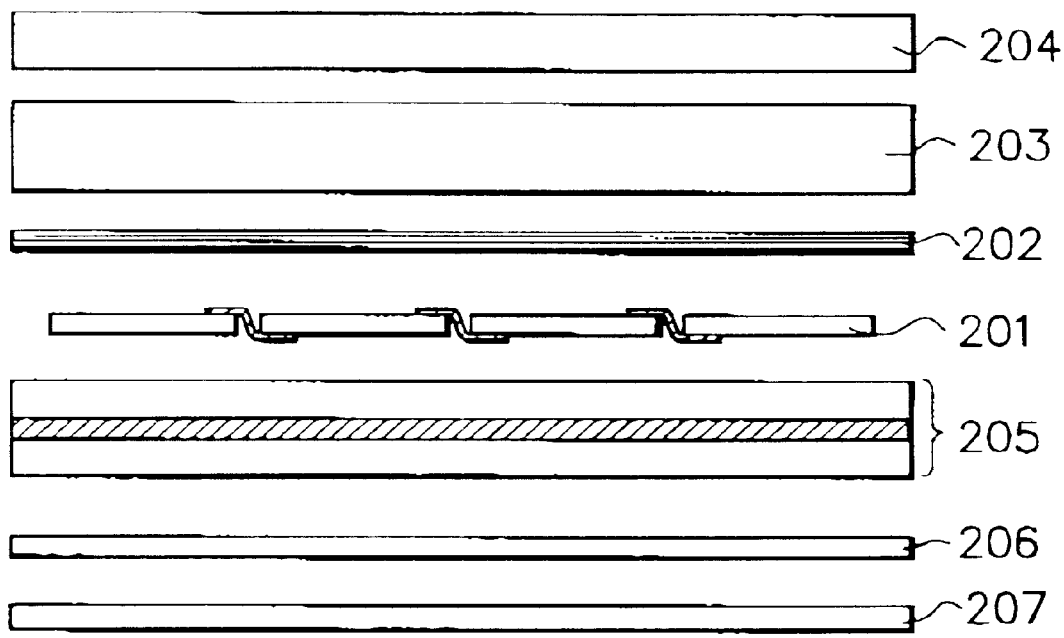

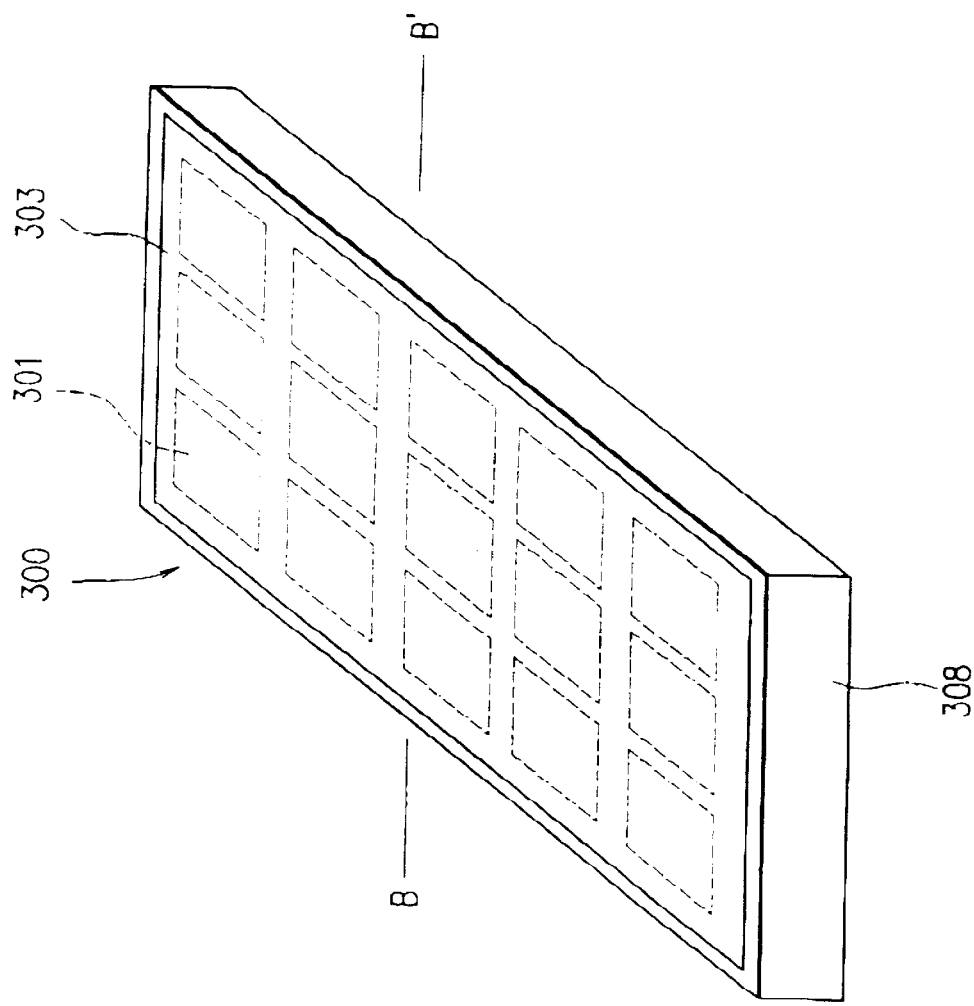

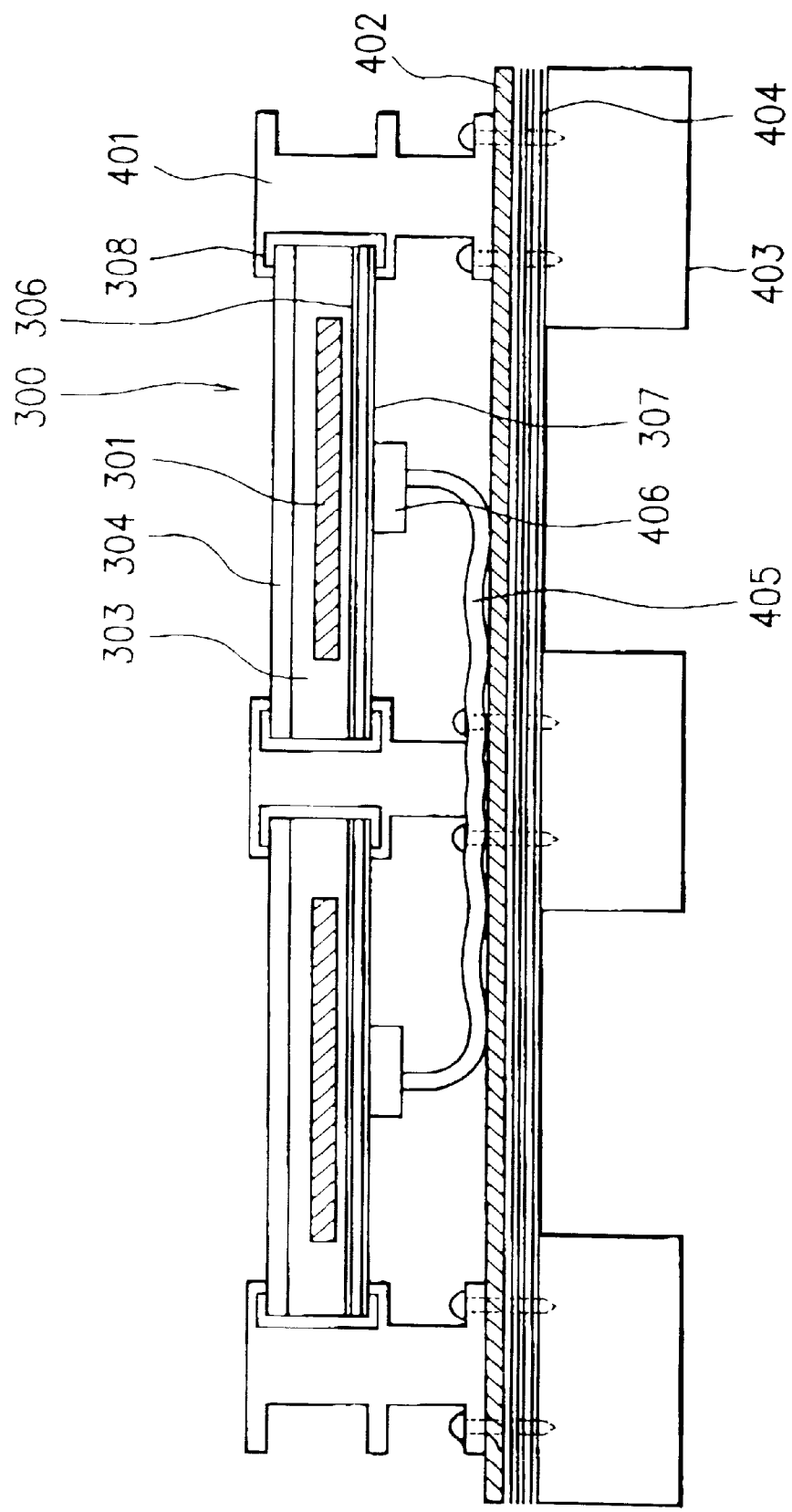

SOLAR CELL MODULE, SOLAR CELL-BEARING ROOF AND SOLAR CELL POWER GENERATION SYSTEM

BACKGROUND OF THE INVENTION

1. Field of the Invention

The present invention relates to a solar cell module having a photovoltaic element provided therein and which has a porous incombustible member having a structural strength and a back face member provided in this order on a back face side of said photovoltaic element, a solar cell-bearing roof in which said solar cell module is used, and a solar cell power generation system in which said solar cell module is used.

2. Related Background Art

In recent years, societal consciousness of the energy resources and the problems relating to the environment has been increasing all over the world. Particularly, apprehensions for possible exhaustion of petroleum and the like and also for heating of the earth because of the so-called greenhouse effect due to an increase of atmospheric $CO_2$ have been seriously discussing.

Under such circumstance, there is an increased societal demand for early realization of a power generation system capable of providing clean energy without causing $CO_2$ buildup as in the case of thermal power generation.

As such power generation system, public attention has been focused on a solar cell power generation system in which a solar cell module comprising a photovoltaic element (or a solar cell) provided therein is used, for the reason that it generates clean electric energy (power) by way of directly converting sunlight into said electric energy, without causing environmental destruction, where said sunlight Is evenly accessible at any place in the world.

As typical examples of such photovoltaic element used in the solar cell power generation system, there are known crystalline silicon series photovoltaic elements (solar cells) in which crystalline silicon semiconductor materials are used and amorphous silicon series photovoltaic elements (solar cells) in which amorphous silicon semiconductor materials are used.

Aforesaid solar cell module typically comprises at least a photovoltaic element group comprising a plurality of such photovoltaic elements electrically serialized which is sealed by a sealing resin and a surface protective member comprising a glass plate or a transparent resin film which is provided on the light receiving face side of the photovoltaic element group sealed by the sealing resin As the sealing resin, an organic polymer resin such as EVA (ethylene-vinyl acetate copolymer) or the like is generally used.

Such solar cell module is generally used by installing it on a desired installation place such as a roof of a building which is evenly accessible to sunlight, in order to obtain an electric power. The solar cell module used in this way is configured in the form of a roof-integral type solar cell module, an on-roof installation type solar cell module, an on-trestle installation type solar cell module, or the like.

In the case where the installation place is of a large area such as a roof of a building, it generally takes such a manner that a plurality of given solar cell modules are arranged thereon while being electrically connected with each other to establish a solar cell module array thereon.

Now, in the case where a plurality of solar cell modules having such configuration as above described are installed on a roof of a building in such way as above described, there have been pointed out that such problems as will be described below are liable to entail.

That is, Japanese Unexamined Patent Publication No. 86066/1996 (hereinafter referred to as document 1) describes that in the case where a plurality of solar cell panels comprising a tempered glass plate, a filler resin (comprising EVA), a photovoltaic element (a photovoltaic element group), a filler resin (comprising EVA) and a layered member (comprising a PVF (polyvinyl fluoride) film/an Al foil/a PVF film) stacked in this order from the light receiving face side are installed on a roof of a building in such way as above described, when a fire is occurred near the building, the fire is spread to the building, and the solar cell panels situated on the eaves side of the roof thereof are exposed to flame or heat radiated from the spreading fire, there is a fear that the glass plates of the solar cell panels involved are broken due to the flame or heat, and their filler resins comprising EVA are heat-fused or burned to flow to the outside.

Japanese Unexamined Patent Publication No. 148614/1997 (hereinafter referred to as document 2) describes that in the case where a plurality of solar cell modules comprising a tempered glass plate, a filler resin (comprising EVA), a photovoltaic element (a photovoltaic element group), a filler resin (comprising EVA) and a layered member(comprising a PVF film/an Al foil/a PVF film) stacked in this order from the light receiving face side are installed on a roof of a building in such way as above described, when a fire is occurred near the building and the fire Is spread to the building, there Is a fear that for the solar cell modules which are exposed to heat radiated from or flame of the spreading fire, their glass plates as the front side protective member are broken due to the heat or flame, and the broken glass plates are scattered or their filler resins comprising EVA are heat-fused to flow to the outside to cause firing at the roof bed.

Those problems mentioned in documents 1 and 2 and other problems which will inferred therefrom can be summarized as follows.

For the solar cell modules having such configuration as above described which are installed on the roof of the building, when a fire is occurred near the building and the fire is spread to the building, (i) their glass plates are broken due to heat radiated from or flame of the spreading wire, where the broken glass plates are scattered; (ii) when the glass plates are broken, the filler resins comprising EVA are heat-fused due to the heat to burn or flow to the outside; (iii) when the heat-fused EVA are flown to reach the roof bed, the roof bed will catch fire and burn; (iv) when the filler resins comprising EVA are heat-fused and burned, not only the scattered glass plate particles but also the photovoltaic elements which are sealed by the filler resins are dropped out to the roof bed.

Now, Japanese Unexamined Patent Publication No. 64396/1997 (hereinafter referred to as document 3) discloses a solar cell module which comprises a body comprising a solar cell having an electrically conductive transparent film bonded to the surf ace thereof and an electrically conductive film bonded to the back face thereof provided between a transparent glass plate and an incombustible back member, and a sealing member provided so as to waterproof a peripheral portion of said body. However, in the production of the solar cell module described in document 3, after the solar cell is produced, the incombustible back member is bonded by means of an adhesive. Thus, there are disadvantages such that the productivity of the solar cell module is inferior and the solar cell module is costly.

Japanese Unexamined Patent Publication No. 69646/1997 (hereinafter referred to as document 4) discloses a solar cell module comprising a solar cell covered by a transparent plate situated on the light receiving face side thereof and a back cover situated on back face side thereof, wherein a mesh body impregnated with an adhesive resin comprising EVA or the like is provided between said solar cell and said transparent plate or/and between said solar cell and said back cover. As said mesh body, there are mentioned a glass fiber unwoven material and the like in document 4. Document 4 describes that because an adhesive resin comprising EVA or the like is impregnated in the mesh body comprising a glass fiber nonwoven material or the like, the adhesive resin is prevented from being dropped and is prevented from being burned in the combustion test, and therefore, the solar cell module is flame resistant or incombustible; and thus, the solar cell module can be used as a roofing material. However, for the solar cell module described in document 4, there is a disadvantage in that when the solar cell module Is installed on a roof and the adhesive resin (EVA) is completely burned out due to a fire occurred in the vicinity of the roof, the solar cell and the like are dropped out onto a sheathing roof board of the roof mainly due to the weight of the solar cell.

Japanese Unexamined Patent Publication No. 302942/1996 (hereinafter referred to as document 5) discloses a structure comprising a solar cell module (a solar cell panel) having a solar cell body provided therein and an incombustible member which is provided on a lower face side of said solar cell module while having an interval between said solar cell body and said incombustible member or without having said interval between said solar cell body and said incombustible member. In the case where incombustible member is provided on the lower face side while having the interval between the solar cell body and the incombustible member, there are disadvantages such that it is necessary to take a procedure that the solar cell module is first produced and thereafter, the incombustible member is provided, and because of this, it takes a lot of time. Document 5 describes that in the case where the incombustible member is provided on the lower face side of the solar cell module so as to have no interval between the solar cell body and the incombustible member, an incombustible member having a plurality of vents is used as the incombustible member. In this case, there are disadvantages such that when the solar cell module is maintained under environmental condition with high temperature over a long period of time, EVA as the filler resin of the solar cell body is liable to ooze out through the vents of the incombustible member, where a sticky material comprising the EVA thus oozed out is occurred. There is also a disadvantage in that due to the vents of the incombustible member, the moisture proof of the solar cell module is liable to deteriorate, where the reliability of the solar cell module is deteriorated Document 5 also describes that a punching metal is used as the incombustible member In this case, there is a disadvantage in that the solar cell module becomes heavy.

Japanese Unexamined Patent Publication No. 227102/1998 (hereinafter referred to as document 6) discloses a solar cell module provided with a wired glass member on the light receiving face side for the purpose of ensuring the safety. For this solar cell module, there is a disadvantage in that because the wired glass member is situated on the light receiving face side of the solar cell module, the light transmittance of the solar cell module is inferior and thus, the photoelectric conversion efficiency of the solar cell module is inferior. Although no glass is scattered when a fire is occurred in the vicinity thereof because of using the wired glass member, the solar cell module has such disadvantages as will be described in the following. That is, cracking is likely to occur at the wired glass member when the fire is occurred, and when the wired glass member is cracked, the fire is liable to invade into the solar cell module through the cracked portions of the wired glass member, where the inside filler resin comprising EVA of the solar cell module is fired and as a result, the photovoltaic element and glass particles caused when the wired glass member is cracked are dropped out.

SUMMARY OF THE INVENTION

The present invention is aimed at solving the foregoing problems in the prior art, and providing a solar cell module which satisfies the requirements which will be described below, a solar cell-bearing roof in which said solar cell module is used and a solar cell power generating system in which said solar cell module is used.

The requirements are: (1) even when the solar cell module is burned, the photovoltaic element and surface member thereof are not dropped out onto a sheathing roof board, (2) the solar cell module is ensured with respect to the moisture proof and is highly reliable, (3) the solar cell module is light weight, (4) the solar cell module can be readily produced at a good yield, and (5) the solar cell module is reasonable in price.

Another object of the present invention is to provide a solar cell module having an outermost surface comprising a surface member on the light receiving face side of said solar cell module, a most back face comprising a back face member on the non-light receiving face side of said solar cell module, and a photovoltaic element between said surface member and said back face member, characterized in that said solar cell module has a porous incombustible member having a structural strength between said photovoltaic element and said back face member.

A further object of the present invention is to provide a solar cell-bearing roof comprising a solar cell module fixed to a sheathing roof board, said solar cell module having an outermost surface comprising a surface member on the light receiving face side of said solar cell module, a most back face comprising a back face member on the non-light receiving face side of said solar cell module, and a photovoltaic element between said surface member and said back face member, characterized in that said solar cell module has a porous incombustible member having a structural strength between said photovoltaic element and said back face member.

A further object of the present invention is to provide a solar cell power generation system comprising a solar cell module and a power conversion device electrically connected to said solar cell module, said solar cell module having an outermost surface comprising a surf ace member on the light receiving face side of said solar cell module, a most back face comprising a back face member on the non-light receiving face side of said solar cell module, and a photovoltaic element between said surface member and said back face member, characterized in that said solar cell module has a porous incombustible member having a structural strength between said photovoltaic element and said back face member.

BRIEF DESCRIPTION OF THE DRAWINGS

FIG. 1(a) is a schematic perspective view illustrating an example of a solar cell module according to the present invention.

FIG. 1(b) is a schematic cross-sectional view, taken along the line A–A' in FIG. 1(a), illustrating an example of the inside structure of the solar cell module shown in FIG. 1(a).

FIG. 1(c) is another schematic cross-sectional view, taken along the line A–A' in FIG. 1(a), illustrating another example of the inside structure of the solar cell module shown in FIG. 1(a).

FIG. 2 is a schematic cross-sectional view illustrating an example of a constitution for lamination materials to be stacked in the production of a solar cell module according to the present invention.

FIG. 3(a) is a schematic perspective view illustrating another example of a solar cell module according to the present invention.

FIG. 4 is a schematic cross-sectional view illustrating an example of a solar cell-bearing roof according to the present invention.

DETAILED DESCRIPTION OF THE INVENTION AND PREFERRED EMBODIMENTS

Figure 3B:
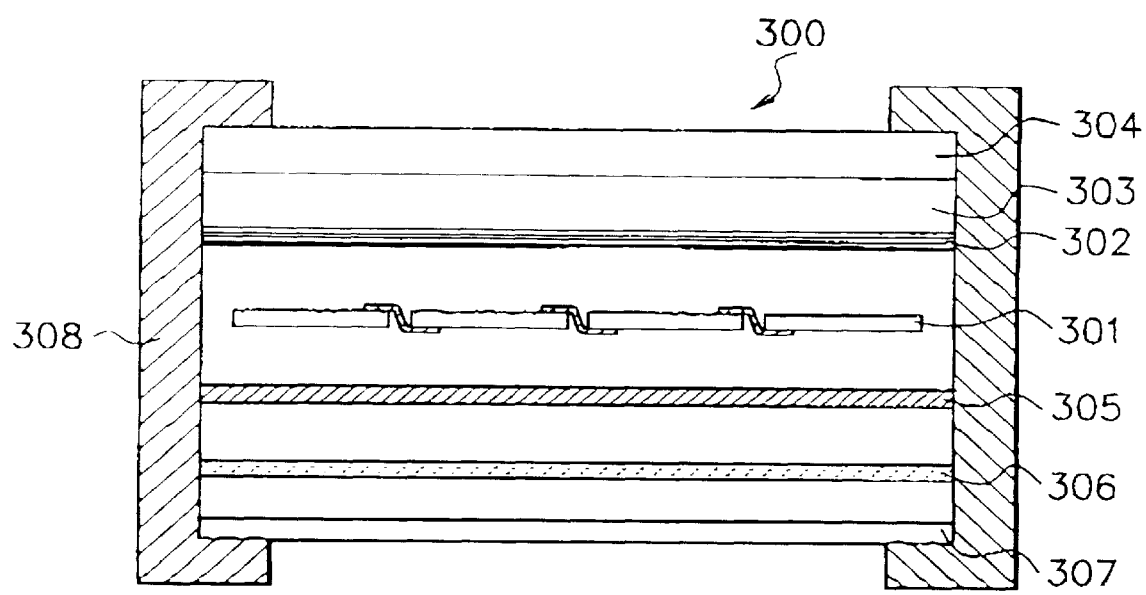
FIG. 3(b) is a schematic cross-sectional view, taken along the line B–B' in FIG. 3(a), illustrating an example of the inside structure of the solar cell module shown in FIG. 3(a).

The present invention is to solve the foregoing problems found in the prior art and to attain the above described objects.

As previously described, the present invention provides a solar cell module having an outermost surface comprising a surface member on the light receiving face side of said solar cell module, a most back face comprising a back face member on the non-light receiving face side of said solar cell module, and a photovoltaic element between said surface member and said back face member, characterized in that said solar cell module has a porous incombustible member having a structural strength between said photovoltaic element and said back face member.

Said porous incombustible member having a structural strength which is used in the present invention is preferred to comprise a member selected from a group consisting of a metal mesh member, an incombustible woven fabric member, a porous ceramic member, and an expanded metal member.

The term "porous incombustible member having a structural strength" in the present invention is meant that the porous incombustible member possesses such a strength that for the surface member and the photovoltaic element which are situated above the porous incombustible member, even when the sum of their weights is applied to the porous incombustible member, the porous incombustible member is maintained without being damaged and still functions to support the photovoltaic element and the surface member while preventing them from being dropped out.

The term "material having a low structural strength" in the present invention indicates such a material that it has a strength which is inferior to aforesaid strength of the porous incombustible member, and when the sum of the weight of the surface member and that of the photovoltaic is applied to the material, the material cannot endure such weight applied thereto to allow the photovoltaic element and the surface member to be dropped out.

The solar cell module structured as above described such advantages as will be described below.

(1) By providing the porous incombustible member having a structural strength between the photovoltaic element and the back face member, even when the solar cell module should be fired, the photovoltaic element and the surface member are not dropped out on the non-light receiving face side, namely, on the sheathing roof board.

(2) By providing the back face member, moisture proof is ensured for the solar cell module and the reliability of the solar cell module is Improved. Particularly, because of having the porous incombustible member having a structural strength and the back face member on the non-light receiving face side of the solar cell module, it is possible to lighten the solar cell module while attaining fire-resistance or incombustibleness and moisture proof for the solar cell module.

(3) As the porous incombustible member having a structural strength, it is preferred to use a member selected from a group consisting of a metal mesh member, an incombustible woven fabric member, a porous ceramic member, and an expanded metal member. By using such member as the porous incombustible member having a structural strength, the advantages described in the above (1) and (2) can be more improved. and the solar cell module can be more lightened (4) The photovoltaic element in the solar cell module of the present invention is resin-sealed by means of a sealing resin comprising an organic polymer resin. It is most appropriate to use EVA (ethylene-vinyl acetate copolymer) as the sealing resin. EVA has been generally using as the sealing material (the filler) in a solar cell module, and therefore, it is satisfactory in terms of the reliability. Thus, the solar cell module whose photovoltaic element is sealed by EVA is satisfactory in terms of the reliability. In addition, EVA is relatively inexpensive. In consequence of this, the production cost of the solar cell module can be reduced.

(5) As the surface member of the solar cell module of the present invention, it is preferred to use a glass member. By using a glass member as the surface member, it is possible to make the solar cell module such that it excels not only in weatherability but also in resistance to external scratching. In addition, the surface member comprising the glass member also excels in moisture proof and therefore, the photovoltaic element of the solar cell module can be protected from moisture invasion thereinto. This situation leads to improving the reliability of the solar cell module.

As previously described, the present invention also provides a solar cell-bearing roof comprising a solar cell module fixed to a sheathing roof board, said solar cell module having an outermost surface comprising a surface member on the light receiving face side of said solar cell module, a most back face comprising a back face member on the non-light receiving face side of said solar cell module, and a photovoltaic element between said surface member and said back face member, characterized in that said solar cell module has a porous incombustible member having a structural strength between said photovoltaic element and said back face member The solar cell-bearing roof provides advantages similar to those described in the above with respect to the solar cell module of the present invention. And since the solar cell-bearing roof is provided on a roof of a building, incident light is allowed to efficiently get into the inside of the solar cell-bearing roof, where the solar cell-bearing roof exhibits a satisfactory photoelectric conversion efficiency.

The present invention further provides a solar cell power generation system comprising a solar cell module and a power conversion device electrically connected to said solar cell module, said solar cell module having an outermost surface comprising a surface member on the light receiving face side of said solar cell module, a most back face comprising a back face member on the non-light receiving face side of said solar cell module, and a photovoltaic element between said surface member and said back face member, characterized in that said solar cell module has a porous incombustible member having a structural strength between said photovoltaic element and said back face member.

The solar cell power generation system of the present invention is that the solar cell module which excels in fireproof of preventing the photovoltaic element and the surface member from being dropped out is used for power generation. Thus, the solar cell power generation system excels in terms of the safety and durability and has a satisfactory power generation efficiency.

In the following, the present invention will be detailed with reference to the drawings.

FIG. 1(a) is a schematic perspective view illustrating an example of a solar cell module according to the present invention. FIG. 1(b) is a schematic cross-sectional view, taken along the line A–A' in FIG. 1(a), illustrating an example of the inside structure of the solar cell module shown in FIG. 1(a), FIG. 1(c) is another schematic cross-sectional view, taken along the line A–A' in FIG. 1(a), illustrating another example of the inside structure of the solar cell module shown in FIG. 1(a). In FIGS. 1(a) to 1(c), reference numeral 100 indicates the entirety of a solar cell module. Reference numeral 101 indicates a photovoltaic element comprising a photovoltaic element group which comprises a plurality of photovoltaic elements electrically connected with each other in series connection or parallel connection (these photovoltaic elements are electrically serialized in this embodiment). The photovoltaic element 101 is sealed by an adhesive organic polymer resin 102. The light receiving face side of the layer of the adhesive organic polymer resin 102 having the photovoltaic element 101 sealed therein is covered by a surface member 103, where the surface member 103 is bonded to said layer of the adhesive organic polymer resin 102. The non-light receiving face side of the layer of the adhesive organic polymer resin 102 having the photovoltaic element 101 sealed therein is covered by a back face member 105. Between the layer of the adhesive organic polymer resin 102 having the photovoltaic element 101 sealed therein and the back face member 105, a porous incombustible member 104 having a structural strength is provided through an adhesive organic polymer resin 102. Reference numeral 106 indicates a frame member. The frame member 106 is provided with a protruded portion 106' which is protruded to the back side of the back face member 105. Reference numeral 107 (see, FIG. 1(c)) indicates a projection which is provided at the frame member 106, separately from the protruded portion 106'.

In the following, description will be made of each of the constituents of the solar cell module of the present invention.

Photovoltaic Element

There is no particular limitation for the photovoltaic element 101 used in the present invention. The photovoltaic element 101 typically comprises at least a photoelectric conversion layer formed on a substrate having an electrically conductive face. The photoelectric conversion layer may comprise a silicon semiconductor material, a compound semiconductor material, or the like. The silicon semiconductor material can include a single-crystalline silicon semiconductor material, a polycrystalline silicon semiconductor material, an amorphous silicon semiconductor material, and the like.

In order to obtain a desired voltage and a desired electric current, the photovoltaic element 101 is desired to comprise a photovoltaic element group comprising a plurality of photovoltaic elements electrically serialized with each other as shown in FIGS. 1(a) to 1(c). In the case where a plurality of photovoltaic elements respectively formed on a substrate comprising a glass plate or a film are electrically serialized with each other, their electrical serialization may be conducted by way of laser patterning technique or the like.

Organic Polymer Resin

The organic polymer resin 102 is used for the purposes of covering irregularities present at the photovoltaic element 101 by the resin and protecting the photovoltaic element from severe external environments such as temperature changes, moisture, external shocks and the like. In this connection, The organic polymer resin 102 is required to excel in weatherability, adhesion, heat resistance, cold resistance, and shock resistance, and also in packing performance. Preferable specific example of such organic polymer resin which satisfies these requirements are EVA (ethylene-vinyl acetate copolymer), EMA (ethylene-methylacrylate copolymer), EEA (ethylene-ethylacrylate copolymer), polyolefin resins such as polyvinyl butyral resin, urethane resins, silicone resins, and fluororesins.

Of these, EVA is the most appropriate for the following reasons. EVA has been generally using as a covering material of a conventional solar cell module. EVA makes it possible to attain a highly reliable covering for the photovoltaic element without changing the constitution of a conventional covering for a photovoltaic element. And EVA is generally available at a reasonable cost.

Surface Member

The surface member 103 is positioned at the outermost surface of the solar cell module 100, and it is used for the purposes of protecting the inside of the solar cell module from being stained with external foreign matter, protecting the inside of the solar cell module from being externally scratched, and protecting the inside of the solar cell module from suffering from moisture invasion and also from being influenced by external pressure. In this connection, the surface member 103 is required to excel in transparency, weatherability (including moisture resistance), pollution resistance, physical strength and durability. Therefore, the surface member 103 is required to comprise a material which satisfies these requirements. Preferable specific example of such material are a glass member, a fluororesin film, and an acrylic resin film. There is no particular limitation for the kind of the glass member. However, in viewpoints of light transmittance in a blue color region, physical strength, and shock resistance, a tempered glass member is most preferred. In the case of a photovoltaic element formed on a substrate comprising a glass plate or a film, it is possible to make said substrate to serve as the surface member.

Back Face Member

The back face member 105 is positioned at the most back face of the solar cell module 100, and it is used for the purpose of protecting the photovoltaic element 101 from suffering from moisture invasion from the outside. The back face member 105 also serves to prevent the organic polymer resin 102 from being softened to be in a sticky state when the solar cell module is used under environmental condition with high temperature. In this connection, the back face member 105 is preferred to comprise a material which has moisture proof and which can isolate the layer of the organic polymer resin 102 having the photovoltaic element 101 sealed therein from external environment. As preferable specific examples of such material, there can be mentioned composite films such as a composite film comprising an aluminum foil sandwiched by fluororesin films (specifically, a composite film comprising a fluororesin film/an aluminum foil/a fluororesin film), a composite film comprising fluororesin films sandwiched by aluminum foils (specifically, a composite film comprising an aluminum foil/a fluororesin film/an aluminum foil/a fluororesin film/an aluminum foil), and the like. These composite films are of low structural strength.

By the way, when a metal steel plate is used as the back face member 105, although the metal steel plate is satisfactory in terms of the foregoing moisture proof, a problem is entailed in that when the glass member is used as the surface member 103, the solar cell module becomes very heavy. In addition, in the case where as the back face member 105 of the solar cell module whose surface member 103 comprises a glass member, a metal steel plate is used, both the surface member and the back face member are difficult to be deformed. In this case, in order for the irregularities of the photovoltaic element 101 to be sufficiently sealed only by means of EVA as the organic polymer resin 102, it is necessary to use the EVA in an amount that can sufficiently absorb the irregularities of the photovoltaic element within the EVA. For this purpose, a large amount of the EVA is necessary to be used. This situation undesirably increases the material cost. In addition, the EVA is a material which has a high combustion energy. In this connection, to use a large amount of the EVA is not desirable. Therefore, it is preferred to minimize the amount of the EVA used as smaller as possible.

Now, in a preferred embodiment of the present invention, any of such composite films as above mentioned is used as the back face member 105. In the case where such composite film is used as the back face member 105, the composite film desirably follows the irregularities of the photovoltaic element 101, where the irregularities of the photovoltaic element can be sufficiently sealed by EVA in a small amount. Thus, it is not necessary to use the EVA in such large amount as in the above case. This situation makes it possible to prevent occurrence of a problem due to the high combustion energy possessed by the EVA and also prevent the material cost from being increased.

Besides, to use such composite film as the back face member 105 is preferred also in a viewpoint of improving the productivity of the solar cell module 100. That is, in the case where a glass member (a glass plate) is used as the surface member 103 and a metal steel plate is used as the back face member 105, because both the glass plate as the surface member and the metal steel plate as the back face member are relatively heavy, in a vacuum lamination process in the production of a solar cell module, deaeration of a stacked body for the production of said solar cell module liable to become insufficient, where the resulting solar cell module is liable to have a defect due to said insufficient deaeration. This situation will leads to decreasing the yield of the solar cell module.

However, in the case where any of the foregoing composite films is used as the back face member, the lamination members for the production of a solar cell module of the present invention are sequentially stacked in the order of starting from the lamination member as the surface member to form a stacked body, and the stacked body is subjected to a thermocompression bonding treatment under reduced pressure, where because the composite film as the back face member and the like which are situated at upper part of the stacked body are relatively light, deaeration of the stacked body in the thermocompression bonding treatment can be sufficiently performed. This situation enables one to effective and readily produce a complete solar cell module having a back face member bonded therein according to the present invention in a single process at a high yield. Therefore, the number of steps of producing a solar cell module according to the present invention is smaller than that in the case of producing a solar cell module by separately fixing a incombustible member and the like to the non-light receiving face side of said solar cell module by way of an independent step. In this consequence, the productivity of the former is higher than that of the latter.

Porous Incombustible Member Having Structural Strength

As previously described, the porous incombustible member 104 having a structural strength is provided between the photovoltaic element 101 (which is sealed in the layer of the organic polymer resin 102) and the back face member 105. The porous Incombustible member 104 functions to prevent the photovoltaic element 101 and the surface member 103 (comprising, for instance, a glass member) from being dropped out to the non-light receiving side of the solar cell module also in the case where a fire is occurred in the vicinity of the solar cell module, the fire is spread to the solar cell module and the layer of the organic polymer resin 102 (comprising EVA or the like) having the photovoltaic element 101 sealed therein gets fired.

As the porous incombustible member 104 having a structural strength, a metal mesh member, an incombustible woven fabric member, a porous ceramic member, and an expanded metal member can be selectively used.

The porous incombustible member 104 comprising any of these members has a number of minute pores. Therefore, the porous incombustible member is very light in comparison with a metal steel plate or the like which is not porous and has no pore.

Aforesaid number of minute pores of the porous incombustible member 104 are preferred to be of such a size that in relation to the surface tension of EVA or the like in a fused state as the sealing resin (the organic polymer resin), it does not allow the fused EVA or the like to pass therethrough. In this case, when a fire is occurred in the vicinity of the solar cell module and EVA or the like as the sealing resin is fused due to heat radiated from the fire, it is possible to prevent the fused EVA or the like from passing through the porous incombustible member 104 to flow on the non-light receiving face side of the solar cell module.

Now, aforesaid expanded metal member which is used as the porous incombustible member 104 has a number of small metal rising portions substantially throughout the entire area thereof. Thus, the expanded metal member has a very large structural strength for its own weight and therefore, it is a preferable member as the porous incombustible member 104. Aforesaid porous ceramic member has a very high melting point in comparison with a metal material and therefore, it is a preferable member as the porous incombustible member 104. Aforesaid metal mesh member and incombustible woven fabric member are preferred to use as the porous incombustible member 104 particularly in a viewpoint that a number of minute pores which do not allow the foregoing fused EVA or the like to pass through can be readily formed therein.

Now, the porous incombustible member 104 is porous and has a number of minute pores as above described. Because of this, the porous incombustible member serves to ensure excellent deaeration in the production process of a solar cell module of the present invention. In this connection, during the production process of the solar cell module, air bubble is prevented from being remained in the sealing resin in which the photovoltaic element is sealed, and excellent deaeration can be ensured also for the solar cell module produced.

Separately, in the case where a fire is occurred in the vicinity of a solar cell module, the fire is spread to the solar cell module and the solar cell module is fired, when the sealing resin of the solar cell module is, for instance, EVA, carbon monoxide and the like are generated.

Such gas generated upon the firing also passes through the number of minute pores of the porous incombustible member 104 to flow outside the solar cell module, and therefore, there is no occasion for said gas to remain in the solar cell module. In this connection, there is no occasion for the inner pressure of the solar cell module to be increased due to such gas. Thus, it is possible to prevent the solar cell module from suffering such a considerable damage that the surface member is dropped out to the non-light receiving surface side thereof.

Further, the porous incombustible member 104 is porous has a number of minute pores and its own weight is light and because of this, it is possible to attain a light weight solar cell module of the present invention.

Frame Member

In the case where the solar cell module has a frame member 106 comprising a metal frame or the like, it is preferred for the frame member 106 to have a protruded portion 106' provided at least at its lower end portion. As shown in FIGS. 1(b) and 1(c), the protruded portion 106' is provided so as to protrude to the back side of the back face member 105 The porous incombustible member 104 is supported by means of the protruded portion 106' through the back face member 105 as shown in FIGS. 1(b) and 1(c). By this, it is possible to prevent the surface member 103 and the photovoltaic element 101 from being dropped out. In addition, as shown in FIG. 1(c), it is possible for the frame member 106 to have a projection 107. As shown in FIG. 1(c), the projection 107 is projected to the back side of the porous incombustible member 104 so as to hold the porous incombustible member from the back side thereon. By this, the porous incombustible member 104 is more surely supported and therefore. it is possible to more prevent the surface member 103 and the photovoltaic element 101 from being dropped out.

Installation Structure of Solar Cell Module

Figure 5:
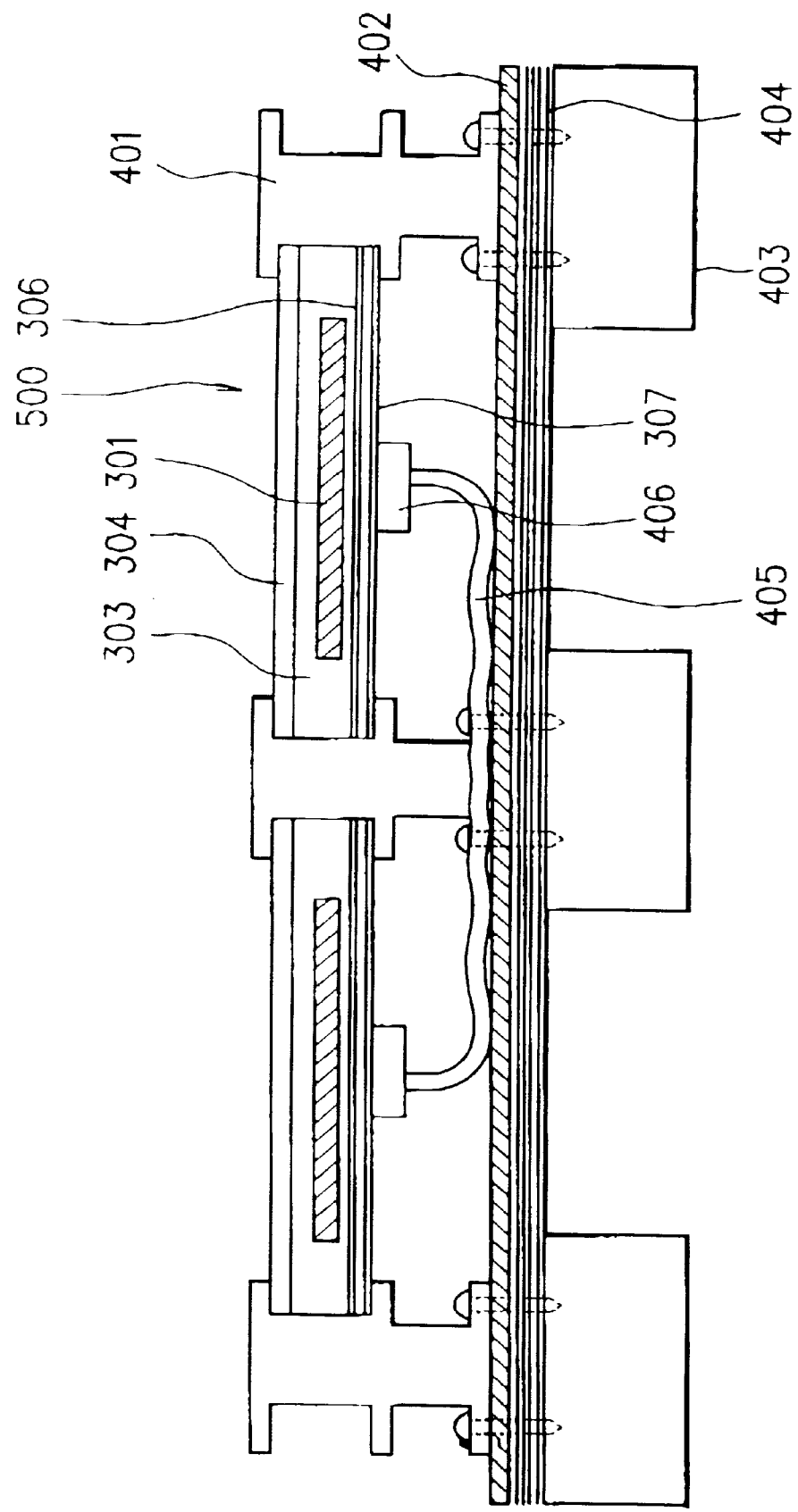
FIG. 5 is a schematic cross-sectional view illustrating another example of a solar cell-bearing roof according to the present invention.

FIG. 4 is a schematic cross-sectional view illustrating an example of a solar cell-bearing roof according to the present invention. FIG. 5 is a schematic cross-sectional view illustrating another example of a solar cell-bearing roof according to the present invention.

In FIGS. 4 and 5, reference numeral 300 (see, FIG. 4) indicates a solar cell module with a frame member, and reference numeral 500 (see, FIG. 5) indicates a solar cell module with no frame member. Reference numeral 301 indicates a photovoltaic element group comprising a plurality of photovoltaic elements electrically serialized with each other, reference numeral 303 a sealing resin, reference numeral 304 a surface member, reference numeral 306 a porous incombustible member having a structural strength, reference numeral 307 a back face member, and reference numeral 308 (see, FIG. 4) a frame member. And reference numeral 401 indicates a fixing member, reference numeral 402 an underlaymennt, reference numeral 403 a rafter, reference numeral 404 a sheathing roof board, reference numeral 405 a wiring cable, and reference numeral 406 a terminal box.

In the solar cell-bearing roof shown in FIG. 4, the solar cell module 300 is mechanically fixed onto the underlaymennt 402 provided on the sheathing roof board 404 by means of the fixing member 401. The porous incombustible member 306 has a structural strength and it is held by the frame member 308 meshed with the fixing member 401. Therefore, in the case where a fire is occurred In the vicinity of the solar cell-bearing roof, the fire is spread and the solar cell module 300 is fired, the surface member 304 and the photovoltaic element group 301 are prevented from being dropped out to the side of the sheathing roof board 404.

In the above, it is possible for the porous incombustible member 306 to be fixed to the frame member 308 by means of metal vises or the like.

The solar cell-bearing roof of the present invention may be formed by installing the solar cell module 500 with no frame member on the underlaymennt 402 provided on the sheathing roof board 404, as shown in FIG. 5. Also in such constitution as shown in FIG. 5, because the porous incombustible member 306 has a structural strength and it is held by means of the fixing member 401, in the case where a fire is occurred in the vicinity of the solar cell-bearing roof, the fire is spread and the solar cell module 500 is fired, the surface member 304 and the photovoltaic element group 301 are prevented from being dropped out to the side of the sheathing roof board 404.

Now, it is more preferred that a trestle made of an incombustible material is used as the fixing member 401 and the porous incombustible member 306 having a structural strength is mechanically fixed to the trestle. In this case, to prevent the surface member 304 and the photovoltaic element group 301 from being dropped out to the side of the sheathing roof board 404 can be more secured.

In the following, the present invention will be described in more detail with reference to examples. It should be understood that these examples are only for illustrative purposes and are not intended to restrict the scope of the present invention to these examples.

EXAMPLE 1

This example will be described with reference to FIG. 2 and FIGS. 3(a) and 3(b).

FIG. 2 is a schematic cross-sectional view illustrating an example of a constitution for lamination materials to be stacked in the production of a solar cell module according to the present invention. FIG. 3(a) is a schematic perspective view illustrating an example of a solar cell module according to the present invention, and FIG. 3(b) is a schematic cross-sectional view, taken along the line B–B' in FIG. 3(a), illustrating an example of the inside structure of the solar cell module shown in FIG. 3(a).

In FIG. 2, reference numeral 201 indicates a photovoltaic element group comprising a plurality of photovoltaic elements electrically serialized with each other, reference numeral 202 a nonwoven glass fiber member, reference numeral 203 a surface side sealing resin, reference numeral 204 a surface member, reference numeral 205 an insulating member comprising an insulating material sandwiched between a pair of sealing resins, reference numeral 206 a porous incombustible member having a structural strength, and reference numeral 207 a back face member. In FIGS. 3(a) and 3(b), reference numeral 300 indicates a solar cell module, reference numeral 301 a photovoltaic element group comprising a plurality of photovoltaic elements electrically serialized with each other, reference numeral 302 a nonwoven glass fiber member, reference numeral 303 a surface side sealing resin, reference numeral 304 a surface member, reference numeral 305 an insulating member, reference numeral 306 a porous incombustible member having a structural strength, reference numeral 307 a back face member, and reference numeral 308 a frame member made of aluminum.

Provision of Lamination Materials (1) Photovoltaic Element

There was provided a photovoltaic element group 201 obtained by electrically serializing a plurality of photovoltaic elements with each other.

(2) Surface Side Covering Materials

As the surface member 204, there was provided a tempered glass plate.

As the surface side sealing resin 203, there was provided a sheet comprising EVA (ethylene-vinyl acetate copolymer).

There was also provided a nonwoven glass fiber member 202 for the purpose improving deaeration on the light receiving face side upon producing a solar cell module.

(3) Back Side Covering Materials

The insulating member 205 is used in order to isolate the photovoltaic element group 201 from outside environment. As the insulating member 205, there was provided a composite insulating member comprising a PET (polyethylene terephthalate) film sandwiched a pair of EVA materials. The EVA here is the same as that used as the surface side sealing resin. The use of this composite insulating member whose opposite surfaces comprising EVA makes it possible to diminish the time required for the material lamination in the production process of a solar cell module.

As the porous incombustible member 206 having a structural strength, there was provided a metal mesh member made of aluminum.

As the back face member 207, there was provided a composite film comprising an aluminum foil sandwiched between a pair of PVF (polyvinyl fluoride) films.

Now, it is not necessary to use a sealing resin between the porous incombustible member 206 and the back face member 207 at the state of stacking the lamination material involved, for the following reason. That is, in the process of subjecting a staked body comprising the lamination materials to a thermocompression bonding treatment under reduced pressure, the EVA material provided at the back side of the composite member as the insulating member 205 is softened (fused) and oozed out through the pores of the porous incombustible member 206 to flow between the porous incombustible member 206 and the back face member 207 because of the reduced pressure, where the EVA material thus flown functions as an adhesive between the porous incombustible member 206 and the back face member 207, whereby the two members are bonded to each other by means of the EVA material.

Production of Solar Cell Module

The lamination materials provided in the above were stacked in the order shown in FIG. 2 That is, the tempered glass plate 204/the EVA sheet 203/the nonwoven glass fiber member 202/the photovoltaio element group 201/the composite insulating member 205/the aluminum metal mesh member 206/the composite film 207 are sequentially stacked in this order to obtain a stacked body. The stacked body was subjected to a thermocompression bonding treatment using a vacuum laminater for the production of a solar cell module to obtain a solar cell module For the resultant solar cell module, an aluminum frame member 308 was attached to its circumference, and the porous incombustible member (comprising the aluminum metal mesh member) was mechanically fixed to the aluminum frame member by means of vises. By this, a solar cell module having such configuration as shown in FIGS. 3(*a*) and 3(*b*) was completed.

For this solar cell module, even when the EVA materials therein should be entirely burned out due to a fire occurred in the vicinity of the solar cell module, because the tempered glass plate as the surface member 304 and the photovoltaic element group 301 are still held by the aluminum metal mesh member 306, they are prevented from being dropped out on a sheathing roof board or the like (not shown) situated on the non-light receiving face side of the solar cell module.

In addition, during when the solar cell module is used under severe environment with high temperature over a long period of time, if the EVA materials in the solar cell module should be softened, they are prevented from causing a sticky material outside the solar cell module by means of the back face member (comprising the foregoing composite film). Further, the back face member has high moisture proof and because of this, external moisture is prevented from invading into the solar cell module. Thus, the solar cell module can be maintained without suffering from influent of external moisture, the reliability of the solar cell module is ensured. Further in addition, such specific porous incombustible member and such specific composite film as the back face member were used in combination, the solar cell module is light weight and is fire-resisting or incombustible.

EXAMPLE 2

The procedures of Example 1 were repeated, except that an expanded metal member having a structural strength was used as the porous incombustible member 206 having a structural strength, to produce a solar cell module having such configuration as shown in FIGS. 3(*a*) and 3(*b*).

The expanded metal member used in this example is somewhat heavier than the metal mesh member used in Example 1. But the solar cell module obtained in this example is sufficiently light weight. And the solar cell module was found to be significantly advantageous as well as the solar cell module of Example 1.

EXAMPLE 3

The procedures of Example 1 were repeated, except that an incombustible woven fabric member having a structural strength was used as the porous incombustible member 206 having a structural strength, to produce a solar cell module having such configuration as shown in FIGS. 3(*a*) and 3(*b*).

The incombustible woven fabric member used in this example is somewhat costly in comparison with the metal mesh member used in Example 1 and therefore, the production cost of the solar cell module obtained In this example becomes relatively higher. However, the incombustible woven fabric member used in this example is lighter than the metal mesh member used in Example 1. Thus, the solar cell module obtained in this example is lighter than that pbtained in Example 1.

And the solar cell module was found to be significantly advantageous as well as the solar cell module of Example 1.

EXAMPLE 4

The procedures of Example 1 were repeated, except that no aluminum frame member 308 was used, to produce a solar cell module with no aluminum frame member 308. The production process of this solar cell module could be simplified for an extent that the step of attaching the aluminum frame member 308 was omitted. And the solar cell module obtained is significantly advantageous as well as that obtained in Example 1.

In this way, there were produced a plurality of solar cell modules with no aluminum frame member 308.

Then, as shown in FIG. 5, these solar cell modules 500 were installed on a roof. Particularly, each of the solar cell modules 500 was mechanically fixed onto the underlaymennt 402 provided on the sheathing roof board 404 through the fixing member 401 to form a solar cell-bearing roof. In this solar cell-bearing roof, the porous incombustible member (306) each of the solar cell modules 500 has a structural strength and it is held by means of the fixing member 401. When one or more of the solar cell modules 500 are fired, their surface member 304 and their photovoltaic element group 301 are prevented from being dropped out to the side of the sheathing roof board 404.

In the above, for each of the solar cell modules in stalled on the roof, power output terminals (not shown) thereof are gathered In the terminal box 406 provided at the back face thereon, and the wiring cables 405 extending from the terminal boxes 406 of the solar cell modules 500 are electrically connected, followed by being electrically connected to a power conversion device (not shown). By this, there was completed a solar cell power generation system.

Now, as will be understood from the above description, the present invention provides such significant advantages as will be described below.

(1) By providing the specific porous incombustible member having a structural strength between the photovoltaic element, even when the solar cell module should be fired, the photovoltaic element and the surface member are prevented from being dropped out on the non-light receiving face side, namely, on the sheathing roof board.

(2) Because the porous incombustible member having a structural strength is used, deaeration of a stacked body comprising the lamination materials including said porous incombustible member in the production of a solar cell module can be sufficiently and effectively performed. Particularly, it is possible to effectively produce a complete solar cell module already having a back face member bonded thereto in a single process. The number of the steps in this solar cell module-producing process is smaller than that in the case of producing a solar cell module by separately fixing a incombustible member and the like to the non-light receiving face side of said solar cell module by way of an independent step. Therefore, the productivity of the former is higher than that of the latter.

(3) Gas which will be generated when the organic polymer resin as the sealing resin is burned is capable of being deaerated to the outside through the great many pores present in the porous incombustible member and therefore, such gas is not remained in the solar cell module. Therefore, even when the glass member as the surface member should be broken at the time when the organic polymer resin as the sealing resin is burned, particles of the broken glass member are prevented from being scattered.

(4) Because the porous incombustible member is provided on the back face side of the photovoltaic element, there is no occasion for the power generation performance of the solar cell module to be deteriorated due to the presence of the porous incombustible member.

(5) Because the porous incombustible member having a structural strength is porous and light weight, it is possible to attain a light weight solar cell module having a satisfactory power generation performance. Thus, the roof provided with the solar cell module according to the present invention, that is, the solar cell-bearing roof is excels in vibration resistance.

(6) By providing the porous incombustible member having a structural strength between the photovoltaic element and the back face member and using a film-like material (that is, a composite film) whose structural strength is inferior as the back member, it is possible to attain a light weight solar cell module which is fire-resistant or incombustible and excels in moisture proof and which excels in long time reliability.

(7) By adopting the constitution in that the porous incombustible member having a structural strength is provided between the photovoltaic element and the back face member comprising a film-like material (that is, a composite film) whose structural strength is interior, the composite film as the back face member desirably follows the irregularities of the photovoltaic element 101 in the vacuum lamination step in the production of a solar cell module, where the irregularities of the photovoltaic element can be sufficiently sealed by EVA as the sealing resin in a small amount. Thus, it is possible to provide a light weight and incombustible solar cell module at a reasonable production cost.

What is claimed is:

1. A solar cell module having an outermost surface comprising a surface member provided on the light receiving face side of said solar cell module, a most back face comprising a back face member provided on the non-light receiving face side of said solar cell module, and a photovoltaic element provided between said surface member and said back face member, characterized in that said solar cell module has a porous incombustible member having a structural strength provided between said photovoltaic element and said back face member, said photovoltaic element and said porous incombustible member are integrally enclosed by said surface member and said back face member, and said back face member comprises a film member.

2. The solar cell module according to claim 1, wherein said porous incombustible member comprises a member selected from the group consisting of a metal mesh member, an incombustible woven fabric member, a porous ceramic member, and an expanded metal member.

3. The solar cell module according to claim 1, wherein said solar cell module has a frame member and said frame member is provided at at least a part of a peripheral portion of said solar cell module.

4. The solar cell module according to claim 3, wherein said porous incombustible member is fixed to said frame member.

5. The solar cell module according to claim 1, wherein said photovoltaic element is sealed by an organic polymer resin.

6. The solar cell module according to claim 5, wherein said organic polymer resin comprises ethylene-vinyl acetate copolymer.

7. The solar cell module according to claim 1, wherein said surface member comprises a glass member.

8. A solar cell-bearing roof comprising a solar cell module fixed to a sheathing roof board, said solar cell module having an outermost surface comprising a surface member provided on the light receiving face side of said solar cell module, a most back face comprising a back face member provided on the non-light receiving face side of said solar cell module, and a photovoltaic element provided between said surface member and said back face member, characterized in that said solar cell module has a porous incombustible member having a structural strength provided between said photovoltaic element and said back face member, said photovoltaic element and said porous incombustible member are integrally enclosed by said surface member and said back face member, and said back face member comprises a film member.

9. The solar cell-bearing roof according to claim 8, wherein said porous incombustible member comprises a member selected from the group consisting of a metal mesh member, an incombustible woven fabric member, a porous ceramic member, and an expanded metal member.

10. The solar cell-bearing roof according to claim 8, wherein said solar cell module has a frame member and said frame member is provided at at least a part of a peripheral portion of said solar cell module.

11. The solar cell-bearing roof according to claim 10, wherein said porous incombustible member is fixed to said frame member.

12. The solar cell-bearing roof according to claim 8, wherein said photovoltaic element is sealed by an organic polymer resin.

13. The solar cell-bearing roof according to claim 12, wherein said organic polymer resin comprises ethylene-vinyl acetate copolymer.

14. The solar cell-bearing roof according to claim 8, wherein said surface member comprises a glass member.

15. The solar cell-bearing roof according to claim 8, wherein said porous incombustible member is fixed onto said sheathing roof board by means of a fixing member.

16. A solar cell power generation system comprising a solar cell module and a power conversion device electrically connected to said solar cell module, said solar cell module having an outermost surface comprising a surface member provided on the light receiving face side of said solar cell module, a most back face comprising a back face member provided on the non-light receiving face side of said solar cell module, and a photovoltaic element provided between said surface member and said back face member, characterized in that said solar cell module has a porous incombustible member having a structural strength provided between said photovoltaic element and said back face member, said photovoltaic element and said porous incombustible member are integrally enclosed by said surface member and said back face member, and said back face member comprises a film member.

* * * * *

UNITED STATES PATENT AND TRADEMARK OFFICE
CERTIFICATE OF CORRECTION

PATENT NO.    : 6,437,235 B1
DATED         : August 20, 2002
INVENTOR(S)   : Ayako Komori et al.

It is certified that error appears in the above-identified patent and that said Letters Patent is hereby corrected as shown below:

Title page,
Item [56], References Cited, FOREIGN PATENT DOCUMENTS, -- EP-0123456-A2 1/2000 -- should be inserted.

Column 1,
Line 32, "Is" should read -- is --;
Line 64, "above described" should read -- above-described --;
Line 65, "above described," should read -- above-described, --; and
Line 67, "to entail." should read -- to be entailed. --.

Column 2,
Line 9, "above described," should read -- above-described --;
Lines 9, 26 and 39, "is occurred" should read -- has occurred --;
Lines 10 and 40, "is spread" should read -- spreads --;
Line 25, "above" should read -- above- --;
Line 27, "Is spread" should read -- spreads --; and "Is a" should read -- is a --;
Line 35, "will" should read -- will be --;
Line 38, "above described" should read -- above-described --.

Column 3,
Line 13, "flame resistant" should read -- flame-resistant --;
Line 16, "Is" should read -- is --; and
Line 66, "is occurred" should read -- occurs --.

Column 4,
Line 3, "is occurred" should read -- has occurred --.

Column 5,
Line 27, "above described" should read -- above-described --; and
Line 64, "above described" should read -- above-described has --.

Column 6,
Line 8, "Improved." should read -- improved. --.

UNITED STATES PATENT AND TRADEMARK OFFICE
CERTIFICATE OF CORRECTION

PATENT NO. : 6,437,235 B1
DATED : August 20, 2002
INVENTOR(S) : Ayako Komori et al.

It is certified that error appears in the above-identified patent and that said Letters Patent is hereby corrected as shown below:

Column 10,
Line 22, "is occurred" should read -- has occurred --;
Line 23, "is spread" should read -- spreads --; and
Line 63, "above described." should read -- above-described. --.

Column 11,
Line 1, "being remained" should read -- remaining --;
Line 5, "is occurred" should read -- has occurred --;
Line 6, "is spread" should read -- spreads --;
Line 30, "105" should read -- 105. --; and
Line 41, "therefore." should read -- therefore, --.

Column 12,
Line 1, "mennt" should read -- ment --;
Line 5, "is occurred In" should read -- has occurred in --;
Lines 6 and 21, "is spread" should read -- spreads --;
Line 15, "underlaymennt" should read -- underlayment --;
Line 20, "is occurred" should read -- has occurred --.

Column 13,
Line 52, "FIG. 2" should read -- FIG. 2. --.

Column 14,
Line 9, "during" should be deleted;
Line 20, "Further" should read -- Further, --;
Line 47, "In" should read -- in --;
Line 51, "pbtained" should read -- obtained --; and
Line 62, "for an extent" should read -- to an extent --.

UNITED STATES PATENT AND TRADEMARK OFFICE
CERTIFICATE OF CORRECTION

PATENT NO.    : 6,437,235 B1
DATED         : August 20, 2002
INVENTOR(S)   : Ayako Komori et al.

It is certified that error appears in the above-identified patent and that said Letters Patent is hereby corrected as shown below:

<u>Column 15,</u>
Line 12, "in stalled" should read -- installed --;
Line 14, "gathered In" should read -- gathered in --;
Line 67, "is excels" should read -- excels --.

Signed and Sealed this

Tenth Day of June, 2003

JAMES E. ROGAN
*Director of the United States Patent and Trademark Office*